US009613685B1

(12) United States Patent
Seetharaman et al.

(10) Patent No.: US 9,613,685 B1
(45) Date of Patent: *Apr. 4, 2017

(54) BURST MODE READ CONTROLLABLE SRAM

(71) Applicant: TEXAS INSTRUMENTS INCORPORATED, Dallas, TX (US)

(72) Inventors: Premkumar Seetharaman, Bangalore (IN); Vinod Menezes, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/940,715

(22) Filed: Nov. 13, 2015

(51) Int. Cl.
*G11C 11/00* (2006.01)
*G11C 11/419* (2006.01)

(52) U.S. Cl.
CPC .................. *G11C 11/419* (2013.01)

(58) Field of Classification Search
CPC ..... G11C 11/4094; G11C 7/12; G11C 7/1027; G11C 11/4085
See application file for complete search history.

(56) References Cited

U.S. PATENT DOCUMENTS

| | | | | |
|---|---|---|---|---|
| 8,107,313 | B2 * | 1/2012 | Kobayashi ............... | G11C 8/12 365/230.03 |
| 2006/0268652 | A1 * | 11/2006 | Jeong .................. | G11C 7/1027 365/230.06 |
| 2007/0147160 | A1 * | 6/2007 | Hanzawa ............. | G11C 7/1012 365/230.03 |
| 2008/0025127 | A1 * | 1/2008 | Kanda .................. | G11C 7/1006 365/230.01 |
| 2008/0123450 | A1 * | 5/2008 | Rao ......................... | G11C 7/12 365/203 |
| 2008/0123451 | A1 * | 5/2008 | Rao ......................... | G11C 7/12 365/203 |
| 2016/0064061 | A1 * | 3/2016 | Shimizu .............. | G11C 11/1677 365/158 |
| 2016/0064070 | A1 * | 3/2016 | Menezes ............... | G11C 11/419 365/154 |
| 2016/0071577 | A1 * | 3/2016 | Menezes ............... | G11C 11/419 365/154 |

* cited by examiner

*Primary Examiner* — Tuan T Nguyen
(74) *Attorney, Agent, or Firm* — John R. Pessetto; Charles A. Brill; Frank D. Cimino

(57) ABSTRACT

A static random access memory (SRAM) includes an array of storage cells arranged as rows and columns and a read controller to manage reading from the storage cells. The array of storage cells includes word lines that correspond to the rows and bit lines that correspond to the columns. The read controller is configured to receive a precharge signal and a word line signal and identify consecutive reads from storage cells accessed via a same one of the word lines. The read controller is further configured to, based on the precharge signal and the word line pulse signal indicating that the SRAM is to operate in a partial burst mode, precharge the bit lines no more than once during the consecutive reads and charge the same one of the word lines after each read of the consecutive reads.

20 Claims, 3 Drawing Sheets

BURST MODE READ CONTROLLABLE SRAM

BACKGROUND

Static random access memory (SRAM) is memory that utilizes latching to store each bit. Because SRAM is static, there is no need to periodically refresh the memory, and is, therefore, typically faster, less dense, and more expensive, than dynamic random-access memory (DRAM). Due to SRAM's speed, SRAM is typically used in computer applications that require a fast memory such as cache memory for the central processing unit (CPU), external burst mode SRAM caches, hard disk buffers, router buffers, CPU register files, etc. While SRAM is fast, it also consumes a significant portion of system's level dynamic power. In some cases SRAM may consume as much as 90% of the system level dynamic power.

SUMMARY

The problems noted above are solved in large part by systems and methods for reducing power consumption in static random access memory (SRAM). In some embodiments, a SRAM includes an array of storage cells arranged as rows and columns and a read controller to manage reading from the storage cells. The array of storage cells includes word lines that correspond to the rows and bit lines that correspond to the columns. The read controller is configured to receive a precharge signal and a word line signal and identify consecutive reads from storage cells accessed via a same one of the word lines. The read controller is further configured to, based on the precharge signal and the word line pulse signal indicating that the SRAM is to operate in a partial burst mode, precharge the bit lines no more than once during the consecutive reads and charge the same one of the word lines after each read of the consecutive reads.

Another illustrative embodiment is a method for reducing power consumption in SRAM. The method may comprise precharging a plurality of bit lines of an array of storage cells arranged as rows and columns. The plurality of bit lines corresponds to the columns. The method may also comprise charging a first word line of the array of storage cells. The first word line corresponds to a first of the rows. The method may also comprise identifying consecutive reads from the storage cells accessed via the first word line. The method also may comprise reading, as part of the consecutive reads, a first storage cell and a second storage cell without precharging the bit lines between the reading of the first and second storage cells. The method may also comprise charging the first word line after each read of the consecutive reads.

Yet another illustrative embodiment is an integrated circuit that includes a processor, a read mode signal generator, and SRAM coupled to the processor and the read mode signal generator. The read mode signal generator may be configured to generate a precharge signal and a word line pulse signal. The SRAM comprises an array of storage cells arranged as rows and columns and a read controller to manage reading from the storage cells. The SRAM includes word lines that correspond to the rows and bit lines that correspond to the columns. The read controller comprises precharge circuitry and word line pulse circuitry. The precharge circuitry is configured to identify consecutive reads to storage cells accessed via a same one of the word lines and, based on the precharge signal and the word line signal indicating that the SRAM is to operate in a partial burst mode, precharge the bit lines on fewer than all the consecutive reads. The word line pulse circuitry is configured to, based on the precharge signal and the word line signal indicating that the SRAM is to operate in the partial burst mode, charge the same one of the word lines after each read of the consecutive reads.

BRIEF DESCRIPTION OF THE DRAWINGS

For a detailed description of various examples, reference will now be made to the accompanying drawings in which.

NOTATION AND NOMENCLATURE

Figure 1:
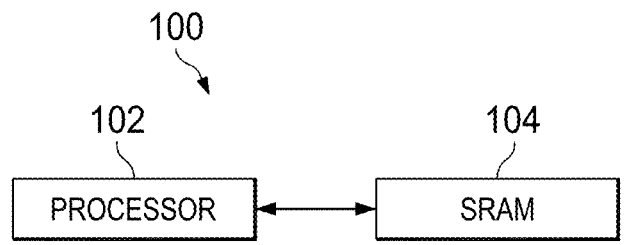
FIG. 1 shows a block diagram of an integrated circuit in accordance with various embodiments.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices and connections. The recitation "based on" is intended to mean "based at least in part on." Therefore, if X is based on Y, X may be based on Y and any number of other factors.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Static random access memory (SRAM) is memory that utilizes latching to store each bit. Because SRAM is static, there is no need to periodically refresh the memory, and is, therefore, typically faster, less dense, and more expensive, than dynamic random-access memory (DRAM). Due to SRAM's speed, SRAM is typically used in computer applications that require a fast memory such as cache memory for the central processing unit (CPU), external burst mode SRAM caches, hard disk buffers, router buffers, CPU register files, etc. Therefore, SRAM is a fundamental building block of many systems. While SRAM is fast, it also consumes a significant portion of system's level dynamic power. In some cases SRAM may consume as much as 90% of the system level dynamic power. Therefore, it is desirable to reduce the power consumption of SRAM.

A conventional SRAM design always precharges each differential pair of bit lines in the columns of a memory storage array on every read access. Therefore, whenever a storage cell in the storage cell array is to be read, a precharge of the bit lines is initiated. Once the bit lines are precharged in the conventional SRAM, the word line corresponding to the row in which the storage cell to be read is charged. This creates a differential voltage in the columns containing the storage cell being read allowing a sense amplifier to read the contents of the storage cell. If another storage cell is to be read, the process repeats beginning with a precharge of the bit lines. This repeated precharging of the bit lines creates a high level of power consumption.

Instead of precharging on every read, each precharge may be done selectively. The bit lines may not be precharged when a linear burst read is performed such that the same row address (i.e., same word line is charged) is utilized for a consecutive read. For example, after a first read of a storage cell, a precharge may not be performed if the next storage cell to be read is on the same word line, but is in a different column of the storage array. This reduces power consumption by as much as 50% in the SRAM. However, in some situations (e.g., if the clock frequency in the system is very low and/or the node has very high leakage), the bit lines may begin to discharge to the point where reading consecutive storage cells without a precharge becomes difficult. Thus, to improve the noise margin so that the charge in the bit lines remains high enough such that the storage cell may be read even without a precharge, the word line may be charged to a predetermined voltage (i.e., pulsed) after each read of the consecutive reads. This enables the bit lines to maintain their charge such that the contents of the storage cells along the word line may be read without precharging the bit lines.

Therefore, the SRAM may operate in three modes: the conventional mode (i.e., the No Burst Mode) where the bit lines are precharged after each read; the Full Burst Mode where the bit lines are not precharged between consecutive reads along the same row address the word line is not pulsed between the consecutive reads; and the Partial Burst Mode where the bit lines are not precharged between consecutive reads along the same row address, but the word line is pulsed after each read of the consecutive reads. Hence, a controller may be implemented to control which of the three modes the SRAM is to operate.

FIG. 1 shows a block diagram of an integrated circuit 100 in accordance with various embodiments. Integrated circuit 100 may include processor 102 and SRAM 104, which may, in some embodiments, be coupled to processor 102. Integrated circuit 100 may also include various additional components, such as transceivers, clock generators, ports, etc.; however, these components have been omitted to promote clarity. Processor 102 may be a control processor, a signal processor, a central processor, or any other type of processor. Processor 102 may be, for example, a general-purpose microprocessor, a digital signal processor, a microcontroller, or other suitable device configured to execute instructions for performing operations. Processor architectures generally include execution units (e.g., fixed point, floating point, integer, etc.), instruction decoding, peripherals (e.g., interrupt controllers, timers, direct memory access controllers, etc.), input/output systems (e.g., serial ports, parallel ports, etc.) and various other components and sub-systems.

SRAM 104 is static random access memory which may provide storage of data and/or instructions that are capable of being processed by processor 102. SRAM 104 is designed such that it exhibits data remanence and utilizes latching circuitry to store each bit of data. SRAM 104 is coupled to processor 102 such that processor 102 may read from and/or write data and/or instructions to SRAM 104 for storage. In some embodiments, SRAM 104 is a part of processor 102 while in alternative embodiments, SRAM 104 is distinct from processor 102. Furthermore, multiple SRAMs 104 may be included in integrated circuit 100.

Figure 2:
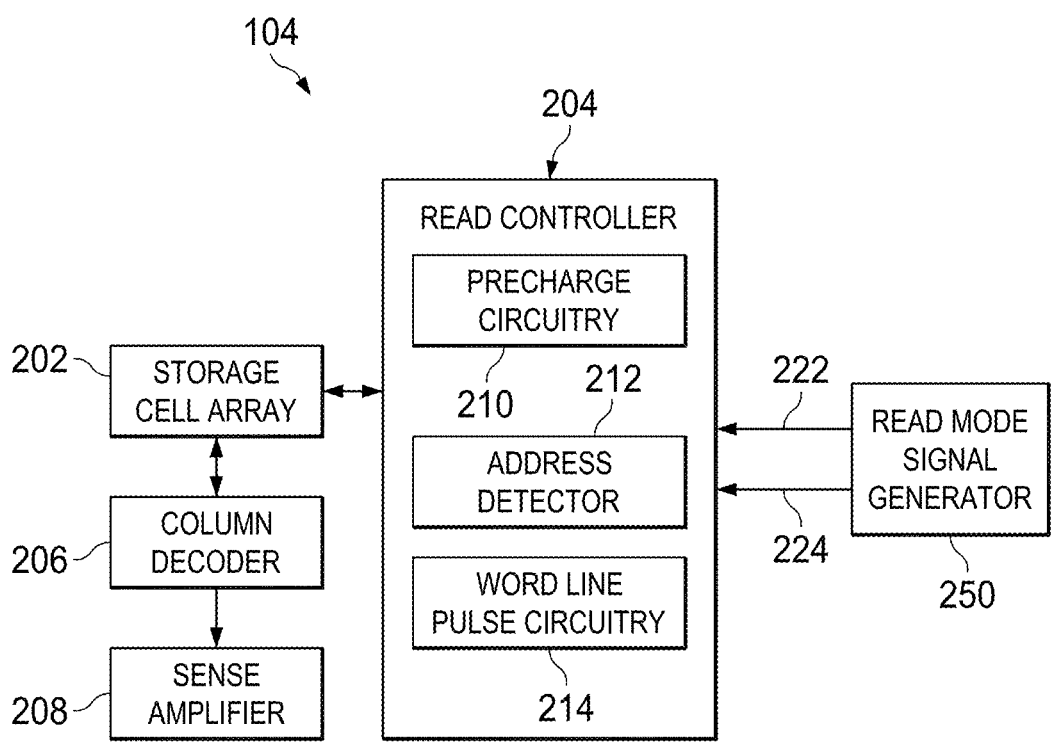
FIG. 2 shows a block diagram of a static random access memory (SRAM) in accordance with various embodiments.

FIG. 2 shows a block diagram of a SRAM 104 in accordance with various embodiments. SRAM 104 may include storage cell array 202, read controller 204, column decoder 206, sense amplifier 208, and read mode signal generator 250. While shown in FIG. 2 as a part of SRAM 104, in alternative embodiments, read mode signal generator 250 may be separate from SRAM 104.

Figure 3:
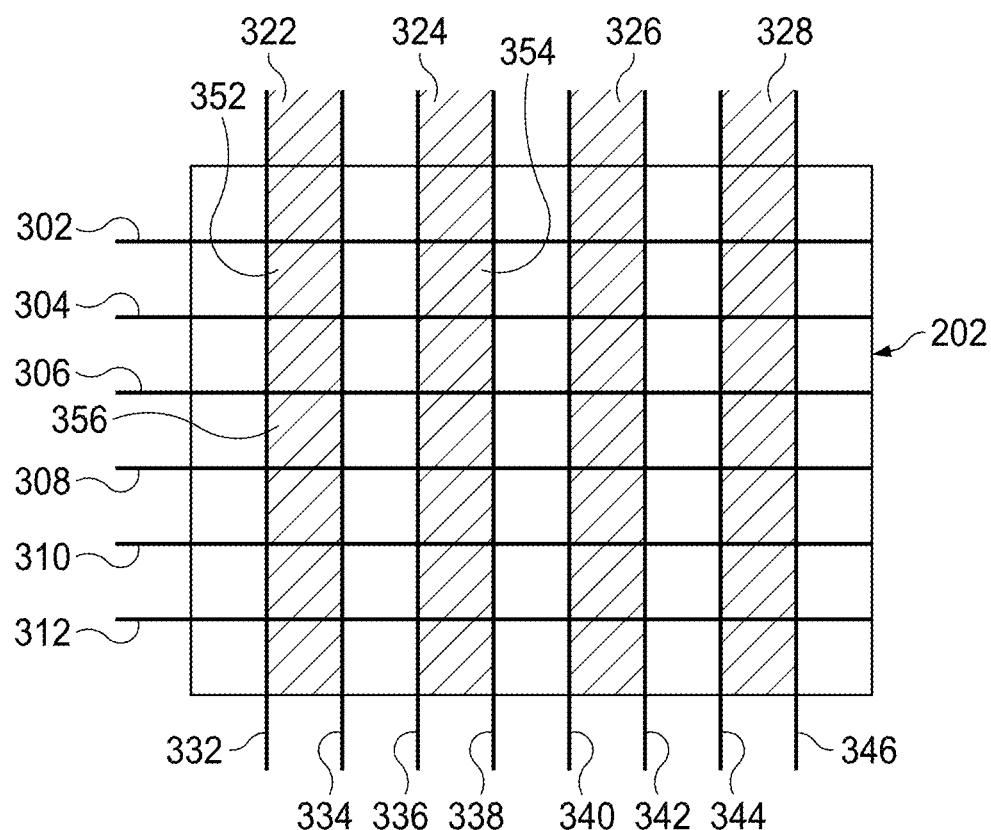
FIG. 3 shows a block diagram of storage cell array in accordance with various embodiments.

Storage cell array 202 may be arranged as rows and columns of storage cells, sometimes referred to as bit cells, each storage cell storing one bit of data. FIG. 3 shows a block diagram of storage cell array 202 in accordance with various embodiments. Storage cell array 202 may include word lines 302-312 which correspond to the rows of storage cell array 202 and columns 322-328. Each of columns 322-328 may be comprised of a differential pair of bit lines. For example, column 322 may be comprised of bit lines 332-334; column 324 may be comprised of bit lines 336-338; column 326 may be comprised of bit lines 340-342; and column 328 may be comprised of bit lines 344-346. At the intersection of each of the word lines 302-312 and the columns 322-328, are the storage cells, such as storage cells 352, 354 and 356, that make up storage cell array 202.

Each of the storage cells in storage array 202, such as storage cells 352, 354, and 356 may be arranged to store a single bit of data. In some embodiments, each of the storage cells comprises a six-transistor ("6T") SRAM cell that is formed with a pair of cross-coupled inverters. Each inverter includes a p-channel transistor and an n-channel transistor. The source of a first pass gate transistor is connected to the gate nodes of the first inverter and the drain nodes of the second inverter. Similarly, the source of a second pass gate transistor, is connected to the gate nodes of the second inverter and the drain nodes of the first inverter. The gates of the pass gate transistors are connected to a common word line, such as word line 302 for storage cells 352 and 354 and word line 308 for storage cell 356, while the drains of the pass gate transistors are connected to a differential pair of bit lines, such as bit lines 332 and 334 for storage cells 352 and 356 and bit lines 336 and 338 for storage cell 354. In alternative embodiments, the storage cells of storage array 202 may be any type of SRAM bit cell, such as a four-transistor ("4T") SRAM cell, an eight-transistor ("8T") SRAM cell, a ten-transistor ("10T") SRAM cell, or any other SRAM storage cell.

Returning to FIG. 2, read controller 204 is coupled to storage cell array 202 and is configured to manage the reading of the storage cells contained in storage cell array 202. Read controller 204 may comprise precharge circuitry 210, address detector 212, and word line pulse circuitry 214. Read controller may be any type of memory controller that manages the flow of data going from and to storage cell array 202. At the beginning of a read cycle, precharge circuitry 210 is configured to cause each of the differential pairs of bit lines (both positive and negative signals) to precharge to a common voltage. In order to read any of the storage cells, the word line corresponding to the storage cell to be read is charged. Thus, word line pulse circuitry 214 is configured to pulse (i.e., to charge the word line to a predetermined voltage) the corresponding word line. For example, if storage cell 352 is to be read, then word line pulse circuitry 214 is configured to charge word line 302 by charging the word line 302 to a predetermined voltage. Once the word line is charged, each of the pass gate transistors from each of the storage cells on the charged word line is enabled. For example, if word line 302 is charged, then pass gate transistors in storage cells 352 and 354, as well as the pass gate transistors for any other storage cell connected to word line 302 are enabled. This causes the bit line voltage for one of the two differential pairs of bit lines connected to each of the storage cells to drop based on whether the storage cell connected to the differential pair stores a 0 or a 1. For example, once word line 302 is charged, the voltage along bit line 332 or 334 will drop based on whether storage cell 352 stores a 0 or a 1. Similarly, the voltage along bit line 336 or 338 will drop based on whether storage cell 354 contains a 0 or a 1.

Column decoder 206 determines which of the columns 322-328 from FIG. 3 contains the storage cell that is to be read. More specifically, column decoder 206 is configured to receive an output signal from each of the columns 322-328 and select the output signal form the column corresponding to the storage cell being read. Each of the output signals corresponds to the differential voltage carried in the differential pair of bit lines. For example, if storage cell 352 is to be read, column decoder 206 selects column 322 and its differential pair of bit lines 332-334. Sense amplifier 208 then may sense which of the selected differential pair of bit lines has the higher voltage through amplification, thus determining whether the storage cell stores a 0 or a 1. In other words, the sense amplifier 208 is configured to determine the state of the selected column by sensing the column voltage differential. Continuing the previous example, once column decoder 206 selects column 322, the sense amplifier will sense, or determine, which of bit lines 332 and 334 has a higher voltage. Once this is determined, the state of storage cell 352 is able to be determined.

Read mode signal generator 250 may be configured to determine which mode of a plurality of modes, the SRAM 104 is to operate. For example, read mode signal generator 250 may be configured to determine whether the SRAM 104 is to operate in a No Burst Mode, a Full Burst Mode, and/or a Partial Burst Mode. In an embodiment, read mode signal generator 250 is programmable and may receive instructions from a user that instructs which of the modes the SRAM 104 is to operate. For example, the read mode signal generator 250 may receive instructions from a user that indicates that the SRAM 104 is to operate in the Partial Burst Mode. In some embodiments, the read mode signal generator 250 may receive instructions from a user that indicates that the SRAM 104 is to operate in a specific mode under certain circumstances while operating in another mode under different circumstances. For example, the read mode signal generator 250 may receive instructions that indicate that the SRAM 104 is to operate in the No Burst Mode if a temperature sensed by a temperature sensor (not shown) exceeds a threshold value and in the Partial Burst Mode if the sensed temperature is less than the threshold value. In this way, the read mode signal generator 250 may automatically determine which mode the SRAM 104 is to operate and, in some embodiments, may make a determination to switch the mode of operation of the SRAM 104 while it is operating.

The read mode signal generator 250 may be configured to generate a precharge signal 222 and a word line pulse signal 224 based on which read mode the signal generator 250 has determined the SRAM 104 is to operate. For example, if the read mode signal generator 250 determines that the SRAM 104 is to operate in the No Burst Mode, the precharge signal 222 would be in a specific state while the word line pulse signal 224 would also be in a specific state (e.g., the precharge signal 222 may be LOW (0) and the word line pulse signal 224 may be LOW (0)). Similarly, if the read mode signal generator 250 determines that the SRAM 104 is to operate in the Full Burst Mode, the precharge signal 222 would be in a specific state while the word line pulse signal 224 would also be in a specific state (e.g., the precharge signal 222 may be HIGH (1) and the word line pulse signal 224 may be HIGH (1)). Furthermore, if the read mode signal generator 250 determines that the SRAM 104 is to operate in the Partial Burst Mode, the precharge signal 222 would be in a specific state while the word line pulse signal 224 would also be in a specific state (e.g., the precharge signal 222 may be HIGH (1) and the word line pulse signal 224 may be LOW (0)). Thus, the combination of the precharge signal 222 and the word line pulse signal 224 may indicate which of the read modes the SRAM 104 is to operate.

Read controller 204 may receive the precharge signal 222 and the word line pulse signal 224 from the read mode signal generator 250. The read controller then may be configured to determine which mode the SRAM 104 is to operate based on the received precharge signal 222 and word line pulse signal 224.

If the read controller 204 determines that the SRAM 104 is to operate in the Full Burst Mode (e.g., the read controller 204 receives a precharge signal 222 that is HIGH and a word line pulse signal 224 that is HIGH), then read controller 204 may identify consecutive reads from storage cells accessed via the same word line. For example, if a read from storage cell 352 is immediately followed by a read from storage cell 354, which is on the same word line, word line 302, as storage cell 352, read controller 204 makes this identification. If an identification is made that consecutive reads from storage cells accessed via the same word line is made by read controller 204, the bit lines 332-346 are not precharged between these two reads. Because charging a specified word line creates a differential for each of the storage cells on the word line that represents the state of the bit in each of the storage cells, no precharge is necessary for reading other storage cells on the same word line. Therefore, the bit lines 332-346 may only be precharged once in conjunction with the consecutive reads—prior to, or at the start of the consecutive reads. By reducing the number of precharges (i.e., by not precharging the differential pair of bit lines after every read), power consumed by the SRAM 104 is reduced. Furthermore, when operating in the Full Burst Mode, the word line 302 may not be pulsed after each read of the consecutive reads. For example, the word line 302 may only be pulsed at the beginning of the consecutive reads when it is charged.

At the end of the read cycle (once the consecutive reads ends), precharge circuitry 210 is configured to once again cause each of the differential pairs of bit lines to precharge to a common voltage. More specifically, address detector 212 is configured to determine (i.e., detect) any row address change request in SRAM 104. In other words, address detector 212 is configured to determine if and when a request is made of SRAM 104 to read a storage cell in storage array 202 that is not on the word line currently being read. Once address detector 212 detects the row address change request, read controller 204, utilizing precharge circuitry 210, causes each of the differential pairs of bit lines 332-346 to precharge to enable reading storage cells on the different word line. For example, if storage cell 352 is being read, word line 302 is charged. However, if address detector 212 detects a row address change request, such that storage cell 356 is to be read, then word line 306 needs to be charged. Because word line 306 is a different word line (on a different row) than word line 302, precharge circuitry 210 causes the differential pairs of bit lines 332-346 to precharge. Thus, read controller 204 may store an indication of which word line is last asserted (in this example word line 302). Based on the word line currently being asserted or which will be asserted (word line 306 in this example) being different than the word line last asserted (word line 302), precharge circuitry 210 causes a precharge of the bit lines 332-346.

If the read controller 204 determines that the SRAM 104 is to operate in the No Burst Mode (e.g., the read controller 204 receives a precharge signal 222 that is LOW and a word line pulse signal 224 that is LOW), then the precharge circuitry 210 causes each of the differential pairs of bit lines 332-346 to precharge after each read. In other words, even if read controller 204 identifies consecutive reads from storage cells accessed via the same word line, the precharge circuitry 210 causes each of the differential pairs of bit lines 332-346 to precharge after each individual read. For example, if a read from storage cell 352 is immediately followed by a read from storage cell 354, precharge circuitry 210 will cause a precharge of the bit lines 332-346 to a common voltage after the read of storage cell 352 is complete and prior to the read of storage cell 354.

If the read controller 204 determines that the SRAM 104 is to operate in the Partial Burst Mode (e.g., the read controller 204 receives a precharge signal 22 that is HIGH and a word line pulse signal 224 that is LOW), then read controller 204 may identify consecutive reads from storage cells accessed via the same word line. For example, if a read from storage cell 352 is immediately followed by a read from storage cell 354, which is on the same word line, word line 302, as storage cell 352, read controller 204 makes this identification. If an identification is made that consecutive reads from storage cells accessed via the same word line is made by read controller 204, the bit lines 332-346 are not precharged between these two reads in a similar manner as when the SRAM 104 is to operate in the Full Burst Mode. Because charging of a specified word line creates a differential for each of the storage cells on the word line that represents the state of the bit in each of the storage cells, no precharge is necessary for reading other storage cells on the same word line. Therefore, the bit lines 332-346 may only be precharged once in conjunction with the consecutive reads—prior to, or at the start of the consecutive reads. Similar to the Full Burst Mode, once address detector 212 detects a row address change request, read controller 204, utilizing precharge circuitry 210, causes each of the differential pairs of bit lines 332-346 to precharge to enable reading storage cells on the different word line. By reducing the number of precharges (i.e., by not precharging the differential pair of bit lines after every read), power consumed by the SRAM 104 is reduced.

However, after a period of time elapses from the charging of a word line, the differential pair of bit lines 332-346 may begin to discharge to the point where reading the storage cell becomes difficult. Thus, to improve the noise margin so that the charge in the bit lines 332-346 remains readable even without a precharge, the charged word line (e.g., word line 302) may be charged to a predetermined voltage (i.e., pulsed) after each read of the consecutive reads. This enables the bit lines to maintain their charge such that the contents of the storage cells along the charged word line may be read without precharging the bit lines. For example, if a read from storage cell 352 is immediately followed by a read from storage cell 354, word line pulse circuitry 214 may charge word line 302 to a predetermined voltage after the read of storage cell 352 is complete and prior to the read of storage cell 354. The bit lines 332-346 may only precharge once the consecutive reads ends and address detector 212 detects a row address change request.

Figure 5:
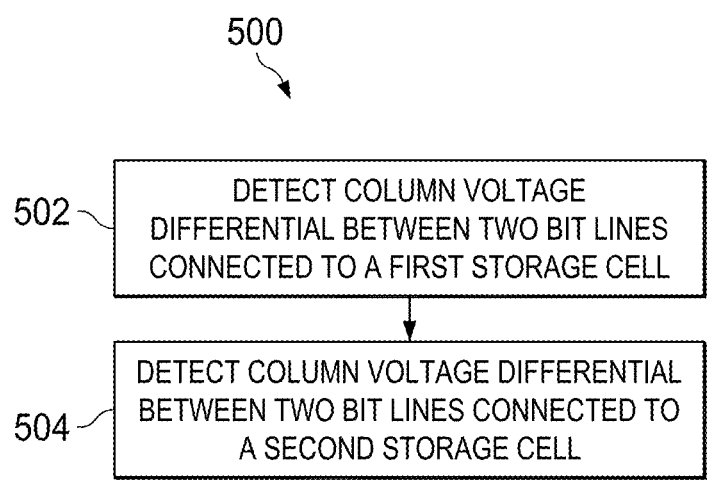
FIG. 5 shows a flow diagram of a method for reading storage cells in a SRAM in accordance with various embodiments.
Figure 4:
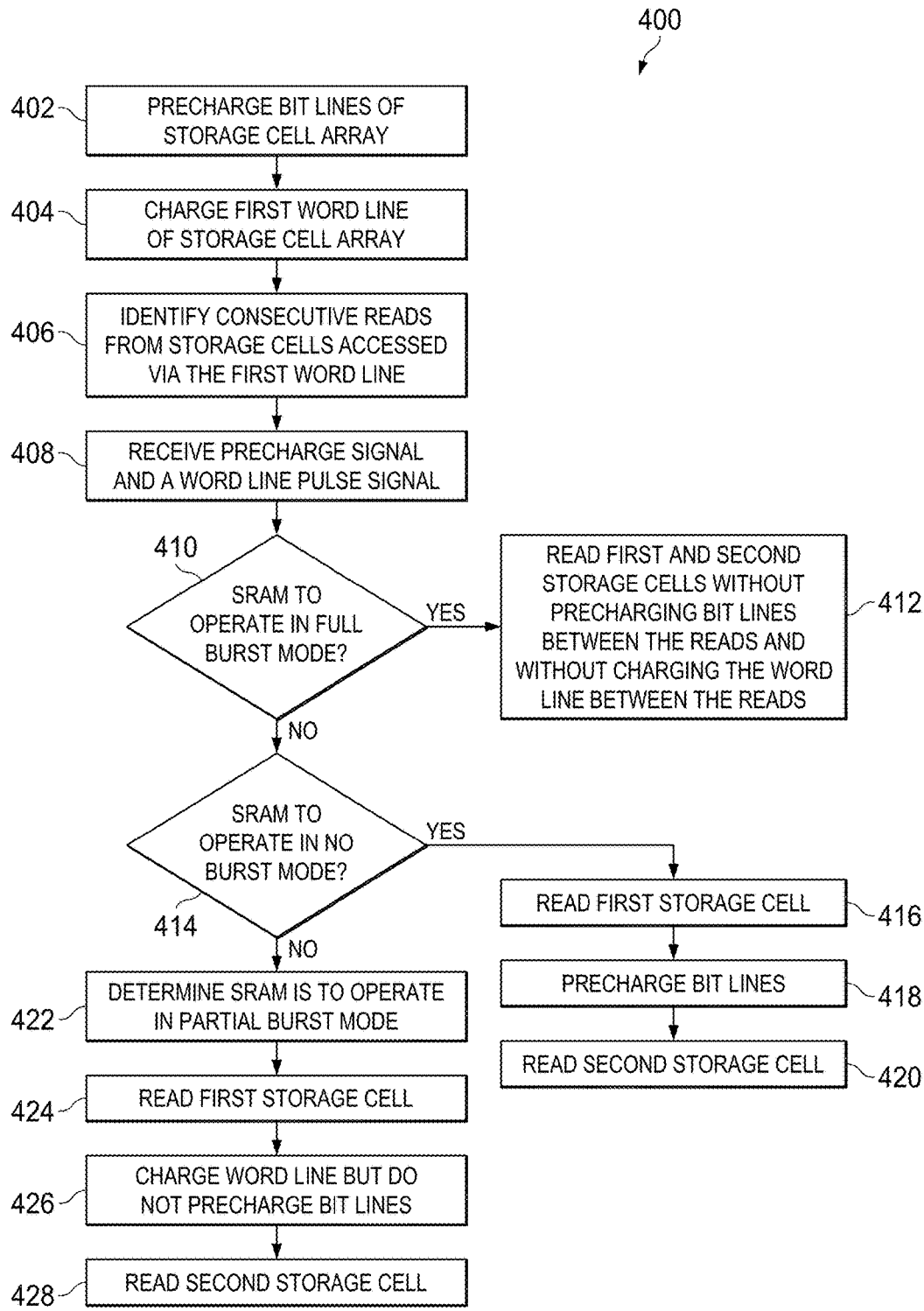
FIG. 4 shows a flow diagram of a method for reducing power consumption in a SRAM in accordance with various embodiments.

FIG. 4 shows a flow diagram of methods 400 for reducing power consumption in a SRAM, such as SRAM 104, in accordance with various embodiments. FIG. 5 shows a flow diagram of a method 500 for reading storage cells in a SRAM, such as SRAM 104, in accordance with various embodiments. Though depicted sequentially as a matter of convenience, at least some of the actions shown in methods 400 and 500 can be performed in a different order and/or performed in parallel. Additionally, some embodiments may perform only some of the actions shown or may perform additional actions. In some embodiments, at least some of the operations of the methods 400 and 500, as well as other operations described herein, can be performed by SRAM 104, read controller 204, and or read mode signal generator 250 implemented by a processor executing instructions stored in a non-transitory computer readable storage medium or a state machine.

The method 400 begins in block 402 with precharging bit lines of a storage cell array, such as bit lines 332-346 of storage cell array 202. In block 404, the method 400 continues with charging a first word line of the storage cell array to a predetermined voltage. For example, word line 302 may be charged so as to read the contents of a storage cell on word line 302, such as storage cell 352. By charging the word line, a differential is created between each of a plurality of differential pairs of bit lines that make up a column in the storage cell array. A column decoder, such as column decoder 206, then may select an output signal from the column corresponding to the storage cell being read, and a sense amplifier, such as sense amplifier 208, may sense the state of the storage cell being read.

The method 400 continues in block 406 with identifying, in some embodiments by read controller 204, consecutive reads from storage cells accessed via the first word line. For example, read controller 204 may be configured to determine whether storage cell 354, which is accessed via word line 302, is being read consecutively after storage cell 352, which is also accessed via word line 302. In block 408, the method 400 continues with receiving, in some embodiments by read controller 204, a precharge signal, such as precharge signal 222, and a word line pulse signal, such as word line pulse signal 224. In some embodiments, the precharge signal and the word line pulse signal are generated by read mode signal generator 250.

The method 400 continues in block 410 with determining, in some embodiments by read controller 204, whether the SRAM, such as SRAM 104, is to operate in a Full Burst Mode. For example, after receiving precharge signal 222 and word line pulse signal 224, the read controller 204 may determine, based on the state of those signals, whether the SRAM 104 is to operate in the Full Burst Mode (e.g., whether precharge signal 222 is HIGH and word line pulse signal 224 is HIGH). If, in block 410, a determination is made the SRAM is to operate in a Full Burst Mode, then the method 400 continues in block 412 with reading a first and second storage cell without precharging bit lines between the reads and without charging the word line between the reads. Continuing the previous example, once the differential of bit lines 332 and 334 are sensed by sense amplifier 208 to read the contents of storage cell 352, the differential of bit lines 336 and 338 are sensed by sense amplifier 208 to read the contents of storage cell 354 without precharging the bit lines 332-346 between the reads and without charging word line 302 between the reads.

If, in block 410, a determination is made the SRAM is not to operate in a Full Burst Mode, then the method 400 continues in block 414 with determining, in some embodiments by read controller 204, whether the SRAM, such as SRAM 104, is to operate in a No Burst Mode. For example, after receiving precharge signal 222 and word line pulse signal 224, the read controller 204 may determine, based on the state of those signals, whether the SRAM 104 is to operate in the No Burst Mode (e.g., whether precharge signal 222 is LOW and word line pulse signal 224 is LOW). If, in block 414, a determination is made the SRAM is to operate in a No Burst Mode, then the method 400 continues in block 416 with reading a first storage cell, such as storage cell 352. In block 418, the method 400 continues with precharging the bit lines, such as bit lines 332-346, or the storage cell array, such as storage cell array 202. The method 400 continues in block 420 with reading a second storage cell, such as storage cell 354, on the same word line as the first storage cell.

If, in block 414, a determination is made the SRAM is not to operate in a No Burst Mode, then the method 400 continues in block 422 with determining, in some embodiments by read controller 204, that the SRAM, such as SRAM 104, is to operate in a Partial Burst Mode. For example, after receiving precharge signal 222 and word line pulse signal 224, the read controller 204 may determine, based on the state of those signals, that the SRAM 104 is to operate in the Partial Burst Mode (e.g., that precharge signal 222 is HIGH and word line pulse signal 224 is LOW). In block 424, the method 400 continues with reading a first storage cell, such as storage cell 352. The method 400 continues in block 426 with charging the word line, such as word line 302, where the first storage cell resides but without precharging the bit lines, such as bit lines 332-346. In block 428, the method 400 continues with reading a second storage cell, such as storage sell 354, on the same word line as the first storage cell.

The method 500 is a method for reading storage cells in a SRAM, such as SRAM 104. The method 500 begins in block 502 with detecting a column voltage differential between two bit lines connected to a first storage cell. For example, if reading storage cell 352, the column voltage differential of column 322 carried by differential pair of bit lines 332 and 334 is detected by sense amplifier 208. In block 504, the method 500 continues with detecting a column voltage differential between two bit lines connected to a second storage cell. For example, if reading storage cell 354 as the second storage cell, the column voltage differential of column 324 carried by differential pair of bit lines 336 and 338 is detected by sense amplifier 208. In this way, storage cells 352 and 354 may be read without precharging the bit lines 332-346 between the reads.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A static random access memory (SRAM), comprising:
   an array of storage cells arranged as rows and columns, and comprising word lines that correspond to the rows and bit lines that correspond to the columns; and
   a read controller to manage reading from the storage cells, the read controller configured to:
      receive a precharge signal and a word line pulse signal;
      identify consecutive reads from storage cells accessed via a same one of the word lines; and
      based on the precharge signal and the word line pulse signal indicating that the SRAM is to operate in a partial burst mode, precharge the bit lines no more than once during the consecutive reads, and charge the same one of the word lines after each read of the consecutive reads.

2. The SRAM of claim 1 wherein the read controller is further configured to, based on the precharge signal and the word line pulse signal indicating that the SRAM is to operate in a full burst mode, precharge the bit lines no more than once during the consecutive reads and charge the same one of the word lines no more than once during the consecutive reads.

3. The SRAM of claim 2 wherein the read controller is further configured to identify that the SRAM is to operate in a full burst mode by determining that the precharge signal is at a same state as the word line pulse signal.

4. The SRAM of claim 1 wherein the read controller is further configured to, based on the precharge signal and the word line pulse signal indicating that the SRAM is to operate in a no burst mode, precharge the bit lines after each read of the consecutive reads.

5. The SRAM of claim 1 wherein the read controller is further configured to perform a precharge of the bit lines at a start of the consecutive reads.

6. The SRAM of claim 1, wherein the read controller is further configured to perform a precharge of the bit lines at an end of the consecutive reads.

7. The SRAM of claim 1, wherein, based on the precharge signal and the word line pulse signal indicating that the SRAM is to operate in a partial burst mode, the read controller is further configured to perform only a single precharge of the bit lines in conjunction with the consecutive reads.

8. The SRAM of claim 1, further comprising:
   a column decoder configured to receive an output signal from each of the columns and select the output signal from the column corresponding to the storage cell being read, each of the output signals corresponding to a differential voltage in each of the columns; and
   a sense amplifier configured to determine a state of the selected column by sensing the column voltage differential for the selected column.

9. A method for reducing power consumption in static random access memory (SRAM), comprising:
   precharging a plurality of bit lines of an array of storage cells arranged as rows and columns, the plurality of bit lines corresponding to the columns;
   charging a first word line of the array of storage cells, the first word line corresponding to a first of the rows;
   identifying consecutive reads from the storage cells accessed via the first word line;
   reading, as part of the consecutive reads, a first storage cell and a second storage cell without precharging the bit lines between the reading of the first and second storage cells; and charging the first word line after each read of the consecutive reads.

10. The method of claim 9, wherein the reading the first and second storage cells comprises:
   detecting a column voltage differential between two bit lines connected to the first storage cell; and
   detecting a column voltage differential between two bit lines connected to the second storage cell.

11. The method of claim 9, further comprising, receiving a precharge signal and a word line pulse signal, wherein the pulsing the first word line after each read of the consecutive reads is based on a determination that the precharge signal and the word line pulse signal indicate that the SRAM is to operate in a partial burst mode.

12. The method of claim 11, further comprising, based on a determination that the precharge signal and the word line pulse signal indicate that the SRAM is to operate in a no burst mode, precharging the bit lines after each read of the consecutive reads.

13. The method of claim 11, further comprising, based on a determination that the precharge signal and the word line pulse signal indicate that the SRAM is to operate in a full burst mode, charge the first word line no more than once during the consecutive reads.

14. The method of claim 9, further comprising:
   precharging the bit lines at a start of the consecutive reads; and
   precharging the bit lines at an end of the consecutive reads.

15. An integrated circuit, comprising:
   a processor;
   a read mode signal generator configured to generate a precharge signal and a word line pulse signal; and
   a static random access memory (SRAM) coupled to the processor and the read mode signal generator, the SRAM comprising:
      an array of storage cells arranged as rows and columns, the SRAM comprising word lines that correspond to the rows and bit lines that correspond to the columns; and
      a read controller to manage reading from the storage cells, the read controller comprising:
         precharge circuitry configured to identify consecutive reads to storage cells accessed via a same one of the word lines and, based on the precharge signal and the word line pulse signal indicating that the SRAM is to operate in a partial burst mode, precharge the bit lines on fewer than all the consecutive reads; and
         word line pulse circuitry configured to, based on the precharge signal and the word line pulse signal indicating that the SRAM is to operate in the partial burst mode, charge the same one of the word lines after each read of the consecutive reads.

16. The integrated circuit of claim 15, wherein the read mode signal generator is programmable.

17. The integrated circuit of claim of claim 15 wherein the read mode signal generator comprises a temperature sensor and is further configured to generate the precharge signal and the word pulse signal based on a temperature sensed by the temperature sensor.

18. The integrated circuit of claim 17, wherein the read mode signal generator is further configured to generate the precharge signal and the word pulse signal indicating that the SRAM is to operate in a no burst mode based on the temperature sensed by the temperature sensor exceeding a threshold value.

19. The integrated circuit of claim 15, wherein:
   the precharge circuitry is further configured to, based on the precharge signal and the word line pulse signal indicating that the SRAM is to operate in a full burst mode, precharge the bit lines no more than once during the consecutive reads; and
   the word line pulse circuitry if further configured to, based on the precharge signal and the word line pulse signal indicating that the SRAM is to operate in the full burst mode, charge the same one of the word lines no more than once during the consecutive reads.

20. The integrated circuit of claim 15, wherein:
   the precharge circuitry is further configured to, based on the precharge signal and the word line pulse signal indicating that the SRAM is to operate in a no burst mode, precharge the bit lines after each read of the consecutive reads.

* * * * *